United States Patent
Hashimoto

(10) Patent No.: US 9,620,401 B2
(45) Date of Patent: Apr. 11, 2017

(54) PRE-ALIGNER APPARATUS

(75) Inventor: Yasuhiko Hashimoto, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 369 days.

(21) Appl. No.: 13/124,777

(22) PCT Filed: Oct. 22, 2008

(86) PCT No.: PCT/JP2008/069138
§ 371 (c)(1),
(2), (4) Date: Apr. 18, 2011

(87) PCT Pub. No.: WO2010/046975
PCT Pub. Date: Apr. 29, 2010

(65) Prior Publication Data
US 2011/0218663 A1 Sep. 8, 2011

(51) Int. Cl.
*H01L 21/677* (2006.01)
*H01L 21/68* (2006.01)
*H01L 21/687* (2006.01)

(52) U.S. Cl.
CPC ...... *H01L 21/681* (2013.01); *H01L 21/67748* (2013.01); *H01L 21/68* (2013.01); *H01L 21/68707* (2013.01); *H01L 21/68742* (2013.01)

(58) Field of Classification Search
CPC .................................................... H01L 23/32
USPC ........................................ 414/783, 217, 936
See application file for complete search history.

(56) References Cited

U.S. PATENT DOCUMENTS

| | | | |
|---|---|---|---|
| 5,100,502 A | 3/1992 | Murdoch et al. | |
| 5,603,777 A * | 2/1997 | Ohashi | .................. 134/25.4 |
| 6,331,095 B1 | 12/2001 | Hiroki | |
| 6,485,248 B1 | 11/2002 | Taylor, Jr. | |
| 6,702,865 B1 | 3/2004 | Ozawa et al. | |
| 2003/0180127 A1 | 9/2003 | Kuroda | |
| 2008/0056857 A1 | 3/2008 | Hiroki | |

(Continued)

FOREIGN PATENT DOCUMENTS

EP 1 197 988 A2 4/2002
JP A-11-288988 10/1999
(Continued)

OTHER PUBLICATIONS

May 17, 2011 Translation of International Preliminary Report on Patentability issued in Patent Application No. PCT/JP2008/069138.
(Continued)

*Primary Examiner* — Gerald McClain
*Assistant Examiner* — Willie Berry, Jr.
(74) *Attorney, Agent, or Firm* — Oliff PLC

(57) ABSTRACT

The apparatus includes a rotary mechanism for holding a semiconductor wafer and rotating the same, a detection mechanism for detecting a positioning cutout portion formed in the wafer, and a wafer transfer mechanism for lifting the wafer from a wafer mounting portion of the rotary mechanism or mounting the wafer on the same. The wafer transfer mechanism has a movable holding portion for holding the wafer at a position just above the wafer mounting portion and is constituted such that the movable holding portion moves up or down while avoiding the wafer held by the rotary mechanism.

6 Claims, 8 Drawing Sheets

(56) References Cited

U.S. PATENT DOCUMENTS

2008/0260500 A1* 10/2008 Meulen ................. B65G 25/02
  414/217
2009/0226294 A1* 9/2009 Sekido et al. ............... 414/806

FOREIGN PATENT DOCUMENTS

| JP | A-11-288995 | 10/1999 |
| JP | A-2002-198418 | 7/2002 |
| JP | A-2004-363218 | 12/2004 |
| JP | A-2005-536878 | 12/2005 |
| JP | A-2007-281249 | 10/2007 |

OTHER PUBLICATIONS

Translation of International Search Report issued in International Patent Application No. PCT/JP2008/069138 dated Nov. 18, 2008.
Mar. 29, 2012 Search Report issued in European Patent Application No. 08877541.6.

* cited by examiner (a)

(b)

(a)

(b)

(c)

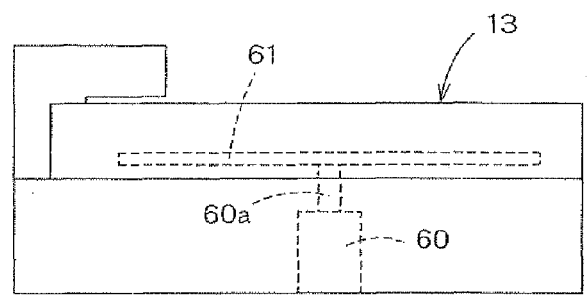
F I G. 4
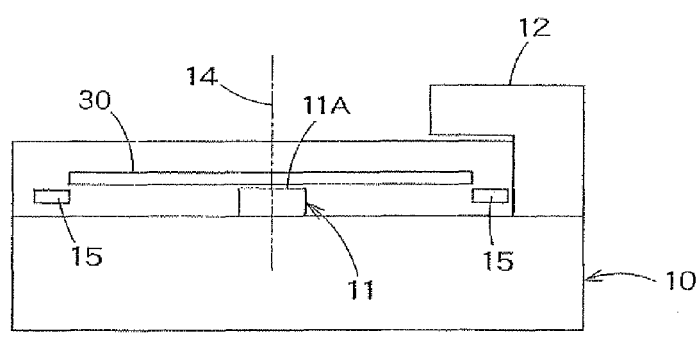
F I G. 5 (a)
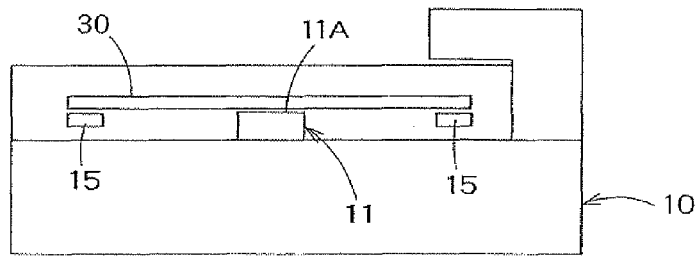
F I G. 5 (b)
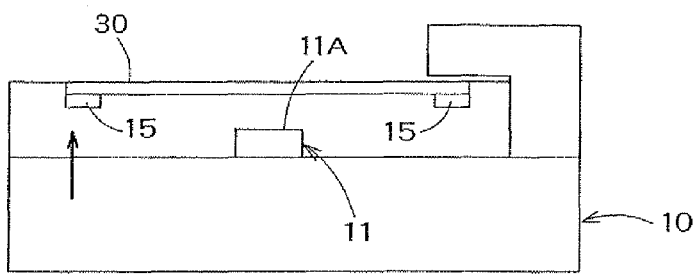
F I G. 5 (c)

(a)

(b)

(c)

(d)

(a)

(b)

(c)

PRE-ALIGNER APPARATUS

TECHNICAL FIELD

The present invention relates to a pre-aligner apparatus for positioning a semiconductor wafer before being processed with a wafer processing apparatus.

BACKGROUND ART

When a semiconductor wafer is processed by a wafer processing apparatus, such as a film forming apparatus, or an etching apparatus, etc., the semiconductor wafer is positioned based on a positioning cutout portion (a notch or an ori-flat) which has been preliminary formed in a periphery of the semiconductor wafer.

The apparatus for positioning a wafer is called a pre-aligner apparatus which includes a rotary mechanism configured to hold a wafer and rotate the same, and a detecting mechanism configured to detect a cutout portion of the wafer, as basic constitution thereof. (Patent Documents 1, 2 and 3)

A wafer is transferred to or from the pre-aligner apparatus by means of, for example, a robot. This wafer transfer robot has, at the distal end of its arm, a hand adapted for holding a wafer.

A wafer carried out from a cassette by the robot is mounted on a mounting portion of the rotary mechanism of the pre-aligner apparatus and held thereon. A cutout portion of the wafer is detected by a detecting mechanism while the wafer is rotated by the rotary mechanism. Thereby, positions of the wafer in the X-Y directions and the rotational direction (θ direction) are detected. This detection operation generally requires about 3-10 seconds.

In recent years, in order to enhance the throughput of wafer processing, the time required for positioning operation by the pre-aligner apparatus is considered to be a problem.

In order to address this problem, for example, a robot is provided with two arms for transferring wafers. This robot is operated such that a wafer which has already been positioned is carried out from the rotary mechanism by one arm, and just after this, a subsequent wafer is carried to a pre-aligner apparatus by the other arm.

According to this case, comparing to the case in which a single arm is used for transferring wafers, the operational time can be reduced as a whole.

[Patent Document 1] JP2007-281249A
[Patent Document 2] JP2004-363218A
[Patent Document 3] JP2005-536878T However, it requires a lot of costs for modifying a robot so as to increase the number of arms from one to two. Accordingly, even if the throughput of wafer processing could be enhanced, the increased costs due to the modification of the robot for providing dual arms offset the reduction effect on the costs for processing wafers.

DISCLOSURE OF THE INVENTION

The present invention has been made, taking into account the above-mentioned situations, to provide a pre-aligner which can enhance the throughput of wafer processing without causing a large amount of cost increase.

In order to achieve the object mentioned above, the pre-aligner apparatus according to the present invention includes a pre-aligner apparatus includes: a rotary mechanism configured to hold a semiconductor wafer and rotate the same, a detection mechanism configured to detect a positioning cutout portion formed in the wafer, and a wafer transfer mechanism configured to lift the wafer from a wafer mounting portion of the rotary mechanism or mount the wafer on the wafer mounting portion, wherein the wafer transfer mechanism includes a movable holding portion configured to hold the wafer at a position just above the wafer mounting portion, the wafer transfer mechanism being constituted such that the movable holding portion moves up or down while avoiding the wafer held by the rotary mechanism.

In order to achieve the object mentioned above, the pre-aligner apparatus according to the present invention includes a pre-aligner apparatus includes: a rotary mechanism configured to hold a semiconductor wafer and rotate the same, a detection mechanism configured to detect a positioning cutout portion formed in the wafer, and a wafer transfer mechanism configured to lift the wafer from a wafer mounting portion of the rotary mechanism, wherein the wafer transfer mechanism includes a movable holding portion configured to move up so as to abut against a rear face of the wafer when lifting the wafer, the wafer transfer mechanism being constituted such that the movable holding portion moves down while avoiding a next wafer held by the rotary mechanism after the wafer lifted by the movable holding portion has been carried out, Preferably, the movable holding portion includes a pair of elongated members respectively disposed on opposing sides with respect to a rotational axis of the rotary mechanism, a distance between the pair of elongated members in a horizontal direction being changeable between a first distance when the wafer is held and a second distance when the pair of elongated members move up or down while avoiding the wafer held by the rotary mechanism, the second distance being greater than the first distance.

Preferably, the wafer transfer mechanism includes a horizontal drive mechanism configured to change a position of the movable holding portion in a horizontal direction, and a lifting drive mechanism configured to change a position of the movable holding portion in a vertical direction.

BRIEF DESCRIPTION OF THE DRAWINGS

FIG. 4 is a diagram for explaining an example of a lifting drive mechanism of the pre-aligner apparatus shown in FIG. 1.

FIG. 5 includes diagrams (a)-(c) showing the state in which a wafer, which has already been positioned, is being lifted by a wafer transfer mechanism of the pre-aligner shown in FIG. 1.

MODE FOR CARRYING OUT THE INVENTION

Hereinafter, the pre-aligner apparatus according to one exemplary embodiment of the present invention will be described with reference to the drawings.

Figure 1:
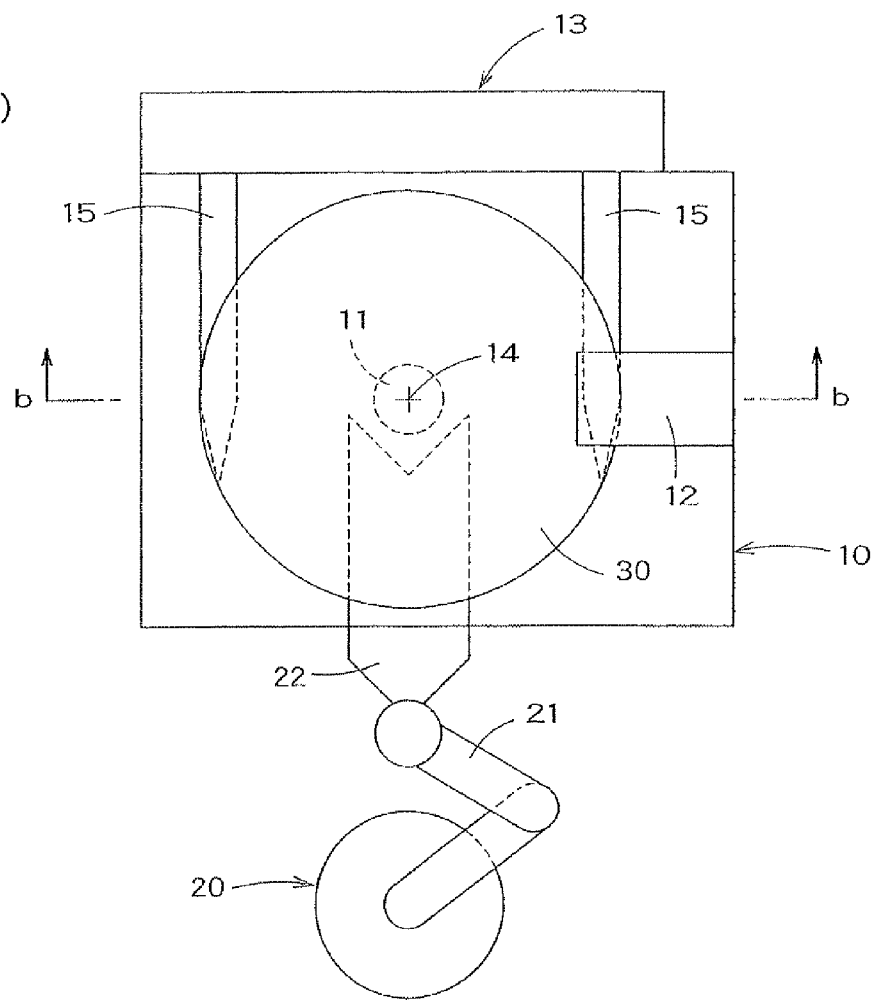
FIG. 1 includes a diagram (a) which is a plan view of a pre-aligner apparatus according to one embodiment of the present invention shown together with a robot for transferring wafers, and a diagram (b) which is a view of vertical section along the line b-b of diagram (a).
Figure 1:
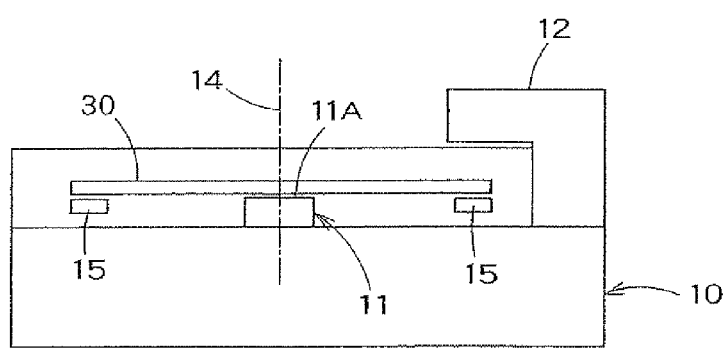

As shown in FIG. 1, the pre-aligner apparatus 10 according to the present invention is provided with a rotary mechanism 11 configured to hold a semiconductor wafer 30 made of substantially circular plate and rotate the same, and a detection mechanism 12 configured to detect a positioning cutout portion (a notch or an ori-flat) which has been preliminary formed in the wafer 30.

The rotary mechanism 11 is provided with a chuck mechanism (not shown) configured to hold the wafer mounted on the mounting face 11A thereof so as to rotate the held wafer 30 about the rotational axis 14.

The detection mechanism 12 is configured to detect the cutout portion of the wafer 30 mounted on the mounting surface 11A of the rotary mechanism 11 by means of, for example, an optical sensor or an image acquiring device (e.g., CCD camera).

The pre-aligner apparatus 10 is further provided with a wafer transfer mechanism 13 configured to lift the wafer 30, which has already been positioned, from the mounting face 11A of the rotary mechanism 11.

The wafer transfer mechanism 13 is provided with a pair of pin members (a movable holding portion) 15 respectively disposed on opposing sides with respect to a rotational axis 14 of the rotary mechanism 11, an opening/closing drive mechanism (a horizontal drive mechanism) configured to change the distance between a pair of pin members 15 in the horizontal direction, and a lifting drive mechanism configured to make a pair of pin members 15 move up and down.

As shown in FIG. 2(a), a pair of pin members 14 are configured to be able to increase the distance therebetween by horizontally moving outward while keeping the parallel relationship thereof.

FIGS. 2(b) and (c) shows the constitution of the opening/closing mechanism in which a pair of pin members 15 are movably supported at their respective proximal ends on a pair of linear guides 40.

One end of each of a pair of first link members 41 is pivotally connected to the proximal end of each of a pair of pin members 15. The other ends of a pair of first link members 41 are pivotally connected to the ends of second link member 42, respectively.

The second link member 42 is rotatably supported at its central part 42a. The distal end of an output shaft 43a of an air cylinder 43 is pivotally connected to the one end 42b of the second link member 42.

The forward/backward movements of the output shaft 43a of the air cylinder 43 are controlled by the signals from the control unit of the pre-aligner apparatus 10.

From the state shown in FIG. 2(b), the air cylinder 43 is driven to move forward the output shaft 43a so that the second link member 42 is rotated about the central part 42a as a fulcrum so as to push outward the pin members 15 via the first link members 41, respectively. Thereby, the pin members 15 slide outward on the linear guides 40, respectively, so that the distance between the pin members 15 in the horizontal direction is increased as shown in FIG. 2(c).

Figure 3:
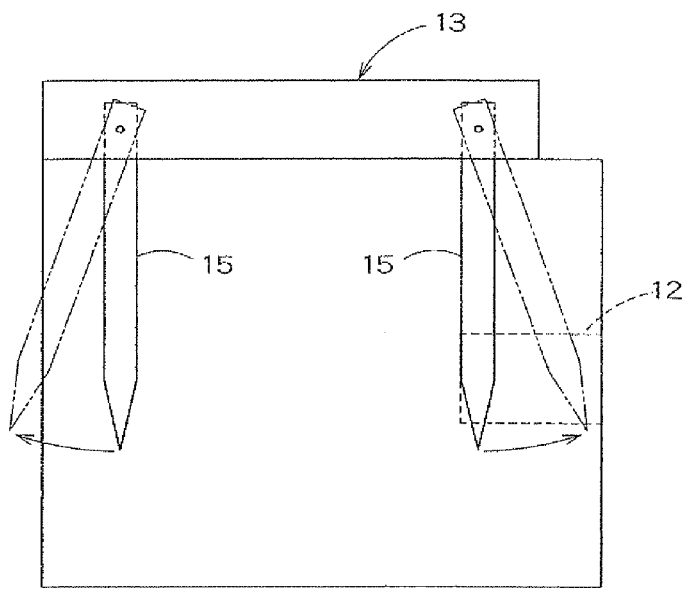
FIG. 3 includes diagrams (a)-(c) for explaining another example of the opening/closing drive mechanism of the pre-aligner apparatus shown in FIG. 1.
Figure 3:
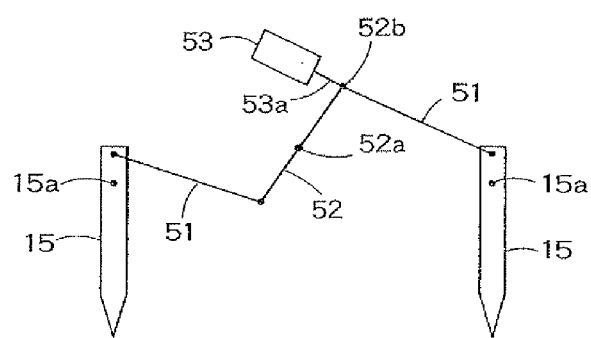
Figure 3:
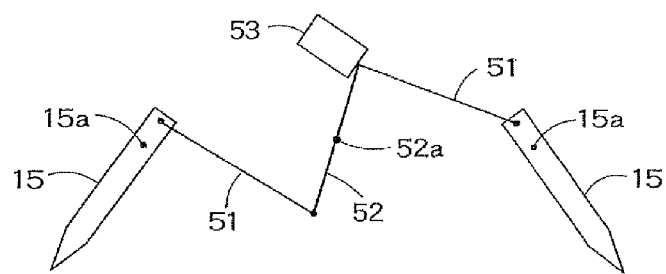

FIG. 3 includes diagrams for explaining another example of the opening/closing drive mechanism. In this example, as shown in FIG. 3(a), a pair of pin members 15 are rotatable about their proximal ends, respectively, so that the distance between the pin members 15 in the horizontal direction can be increased.

FIGS. 3(b) and (c) show the constitution of an opening/closing drive mechanism in this example. The proximal ends of a pair of pin members 15 are configured to be rotatable about the rotational axes 15a, respectively.

One end of each of a pair of first link members 51 is pivotally connected to the portion of each of the pin members 15 located at the proximal side with respect to the rotational axis 15a. The other ends of a pair of first link members 51 are pivotally connected to the ends of second link member 52, respectively.

The second link member 52 is rotatably supported at its central part 52a. The distal end of an output shaft 53a of an air cylinder 53 is pivotally connected to the one end 52b of the second link member 52.

The forward/backward movements of the output shaft 53a of the air cylinder 53 are controlled by the signals from the control unit of the pre-aligner apparatus 10.

From the state shown in FIG. 3(b), the air cylinder 53 is driven to move rearward the output shaft 53a so that the second link member 52 is rotated about the central part 52a as a fulcrum. Thereby, the pin members 15 are rotated via the first link members 51, respectively, so that the distance between the pin members 15 in the horizontal direction is increased as shown in FIG. 3(c).

FIG. 4 shows a lift drive mechanism of the wafer transfer mechanism 13 in which a base member 61 is provided at the distal end of an output shaft 60a of an air cylinder 60. This base member 61 is configured to move up or down by moving upward or downward the output shaft 60a of the air cylinder 60.

The upward/downward movements of the output shaft 60a are controlled by the signals from the control unit of the pre-aligner apparatus 10.

Figure 2:
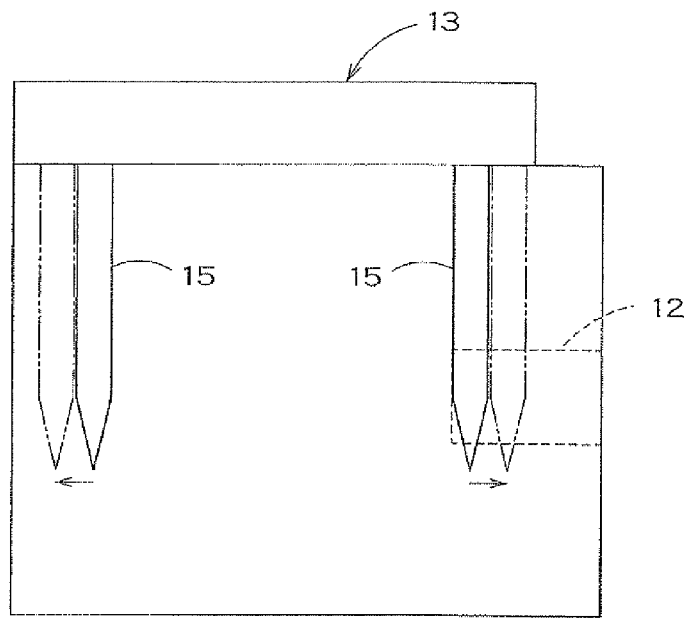
FIG. 2 includes diagrams (a)-(c) for explaining an example of an opening/closing drive mechanism of the pre-aligner apparatus shown in FIG. 1.
Figure 2:
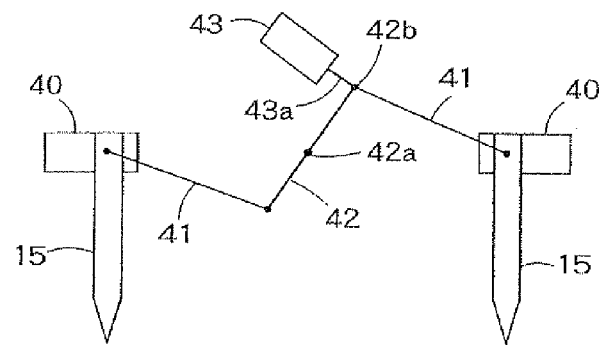
Figure 2:
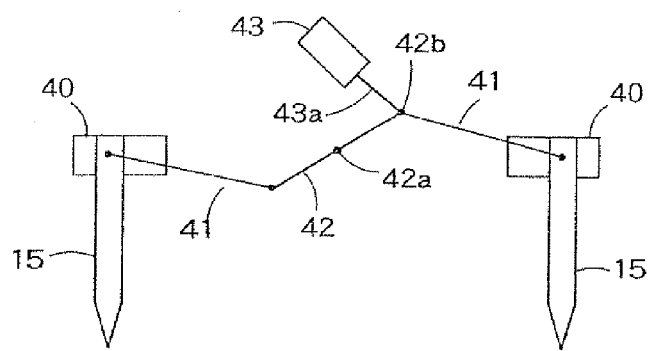

The opening/closing drive mechanism and a pair of pin members 15 shown in FIGS. 2 and 3 are disposed on the base member 61 shown in FIG. 4. Thereby, a pair of pin members 15 can be moved upward/downward together with the opening/closing drive mechanism by driving the air cylinder 60.

When the wafer 30 is mounted on the rotary mechanism 11 of the pre-aligner apparatus 10, the arm 21 of the robot 20 is driven so that the wafer 30 is carried out from a cassette (not shown) by a hand 22 provided to the distal end of the arm 21. The arm 21 is further driven so that the wafer 30 is mounted on the mounting face 11A of the rotary mechanism 11.

Then, the cutout portion of the wafer 30 is detected by the detection mechanism 12 while the wafer 30 is rotated by the rotary mechanism 11. The wafer 30 is positioned in the rotational direction (θ direction) based on the result of detection.

If the wafer 30 has been judged to be eccentric from the rotational axis 14 of the rotary mechanism 11 based on the detection result obtained by the detection mechanism 12, the wafer 30 is relocated to the correct position on the rotary mechanism 11 by the hand 22 based on the calculated amount of eccentricity. Or, the rotary mechanism 11 may be configured to be able to move in X-Y directions so that the eccentricity of the wafer 30 can be adjusted by moving the rotary mechanism 11.

Figure 6:
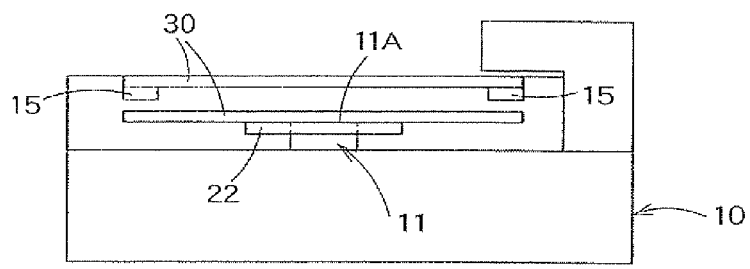
FIG. 6 includes diagrams (a)-(d) showing the state in which the wafer lifted by the wafer transfer mechanism is being exchanged with a subsequent wafer by the pre-aligner apparatus shown in FIG. 1.
Figure 6:
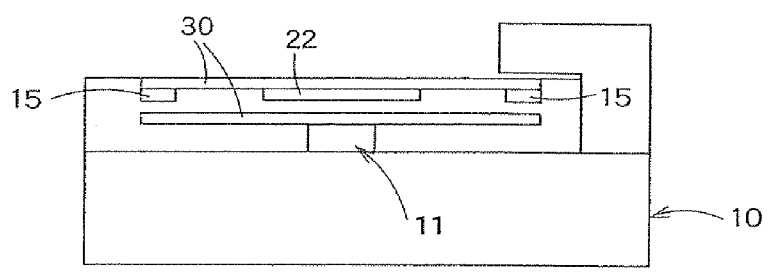
Figure 6:
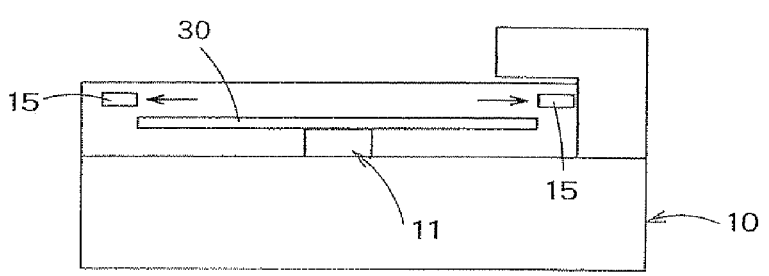
Figure 6:
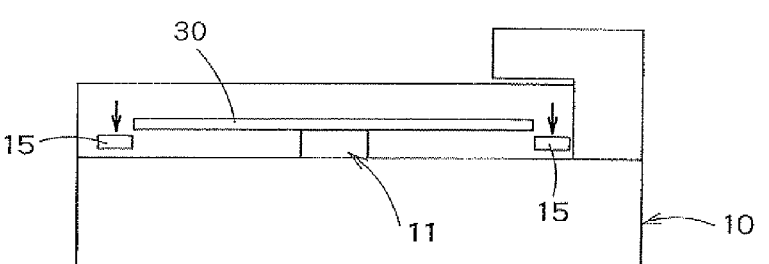

Next, referring to FIGS. 5 and 6, the steps of carrying out a wafer 30, which has already been positioned, from the pre-aligner 10, and a subsequent wafer 30 is mounted on the rotary mechanism 11 will be explained.

During a position detecting operation (an alignment operation) for detecting the position of the wafer 30 by the detection mechanism 12 while the wafer 30 is rotated, a pair of pin members 15 are located at step-aside positions as shown in FIG. 5(a).

When the position detection operation of the wafer 30 has been finished, the opening/closing drive mechanism of the wafer transfer mechanism 13 is operated so that a pair of pin members 15 are moved to be closer to each other and positioned just below the wafer 30.

In this state, the lift drive mechanism of the wafer transfer mechanism 13 is operated so that a pair of pin members 15 abut against the rear face of the wafer 30 as shown in FIG. 5(c), and the wafer 30 is lifted in the upward vertical direction from the mounting face 11A of the rotary mechanism 11.

The vertical position of the pin members 15 when the wafer 30 has been lifted is a position which makes it possible to insert a subsequent wafer 30 held on the hand 22 of the robot 20 into the space between the pin members 15 and the rotary mechanism 11.

Next, in the state where the wafer 30 has been lifted by a pair of pin members 15, a subsequent wafer 30 is mounted on the mounting face 11A of the rotary mechanism 11 by the hand 22 of the robot 20 as shown in FIG. 6(a).

When the subsequent wafer 30 has been mounted on the rotary mechanism 11 by the hand 22 like this, the same hand 11 is used to carry out the wafer 30 on a pair of pin members 15 which has already been positioned as shown in FIG. 6(b).

When the wafer 30 on the pin members 15 has been carried out, the opening/closing drive mechanism of the wafer transfer mechanism 13 is operated so that the distance between a pair of pin members 15 is increased to the step-aside positions.

This distance between the pin members 15 is set such that the pin members 15 don't make contact with the wafer 30 mounted on the rotary mechanism 11 when the pin members 15 are lowered.

Next, the pin members 15 are lowered as shown in FIG. 6(d), and a positioning operation for the subsequent wafer 30 is started.

As mentioned above, according to the pre-aligner apparatus 10 of the present invention, when a wafer 30 which has already been positioned is exchanged with a subsequent wafer 30, the positioned wafer 30 is temporarily lifted by the wafer lift mechanism 13, and in this state, the subsequent wafer 30 can be carried in by the robot 20. Therefore, it is possible to shorten the operation time required for exchanging the wafers 30 in the pre-aligner apparatus 10, thereby, the throughput of wafer processing can be enhanced.

Figure 7:
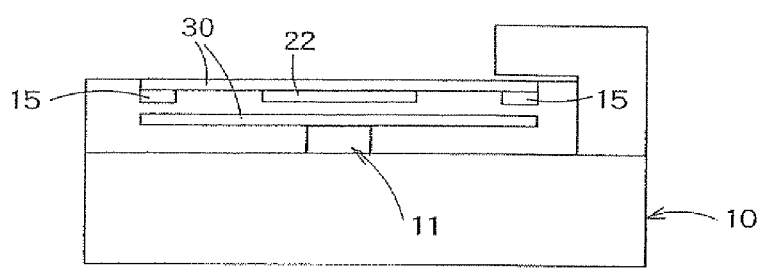
FIG. 7 includes diagrams (a)-(d) showing the state in which the subsequent wafer is mounted on the wafer transfer mechanism, the wafer which has already been positioned is carried out, and the subsequent wafer is mounted on a rotary mechanism.
Figure 7:
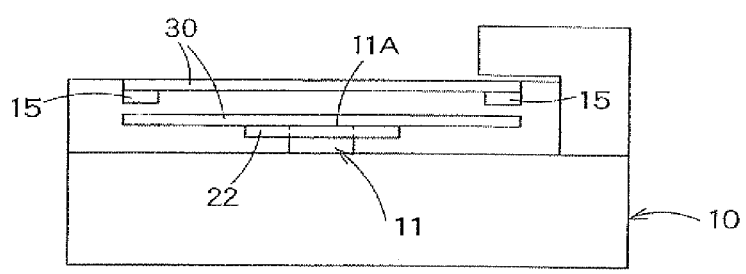
Figure 7:
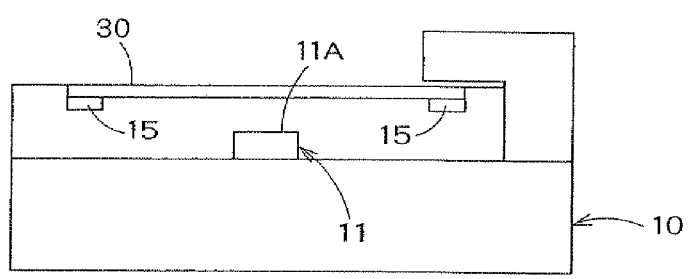
Figure 7:
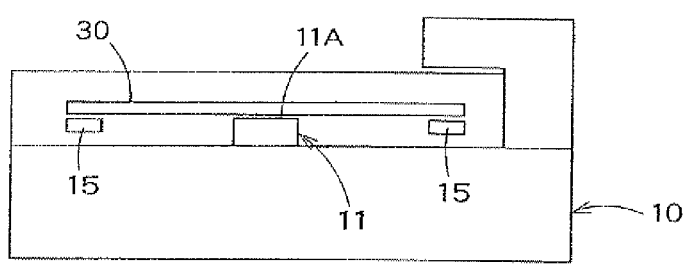
Figure 8:
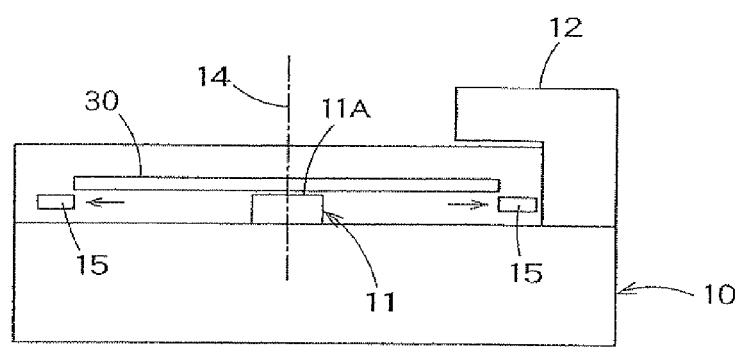
FIG. 8 includes diagrams (a)-(c) showing motions of the wafer transfer mechanism after the subsequent wafer has been mounted on the rotary mechanism of the pre-aligner apparatus.
Figure 8:
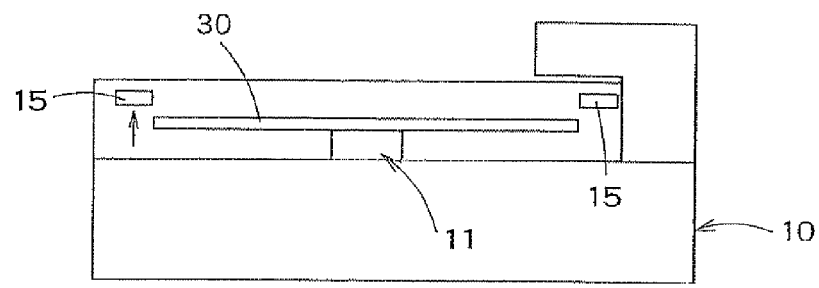
Figure 8:
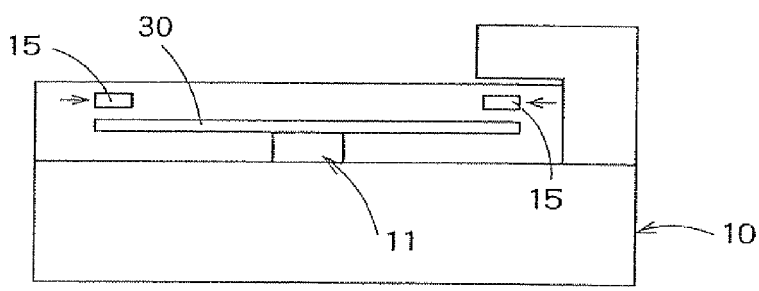

As a modified example of the above-mentioned embodiment, the operational procedures of the wafer transfer mechanism 13 can be changed as shown in FIGS. 7 and 8.

Namely, when the operation for detecting a position of the wafer 30 has been finished, as shown in FIG. 7(a), the subsequent wafer 30 is mounted by the hand 22 of the robot 20 on a pair of pin members 15 located above the wafer 30 of which the position has already been detected.

Next, as shown in FIGS. 7 (b) and (c), the wafer, of which the position has already been detected, is carried out by the hand 22 of the robot 20.

Then, the lift drive mechanism of the wafer transfer mechanism 13 is operated so that a pair of pin members 15 are lowered so as to mount the subsequent wafer 30 on the mounting face 11A of the rotary mechanism 11, as shown in FIG. 7(d).

Subsequently, the opening/closing drive mechanism of the wafer transfer mechanism 13 is operated so that the distance between a pair of pin members 15 in the horizontal direction is increased so as to be located at the set-aside positions, as shown in FIG. 8(a).

In this state, the lift drive mechanism of the wafer transfer mechanism 13 is operated so that a pair of pin members 15 are lifted. At this time, the distance between the pin members 15 is set such that the pin members 15 don't make contact with the wafer 30 mounted on the rotary mechanism 11 when the pin members 15 are lifted.

Next, the opening/closing mechanism of the wafer transfer mechanism 13 is operated so that a pair of pin members 15 are moved to be closer to each other and positioned just over the wafer 30.

Incidentally, the position detecting operation for the wafer 30 is performed prior to the closing motion of a pair of pin members 15 shown in FIG. 8(c).

The example shown in FIGS. 7 and 8 also makes it possible to shorten the operation time required for exchanging the wafers 30 in the pre-aligner apparatus 10, thereby, the throughput of wafer processing can be enhanced.

The wafer transfer mechanism in the pre-aligner apparatus according to the present invention is not limited the wafer transfer mechanism 13 in the above-mentioned embodiment.

Namely, it is enough for the wafer transfer mechanism in the present invention to have movable holding portion (the pin members 15 for the above-mentioned embodiment) for holding the wafer 30 at a position just above the wafer mounting face 11A of the rotary mechanism 11, and be configured such that the movable holding portion can move up or down while avoiding the wafer 30 held by the rotary mechanism 11.

Figure 9:
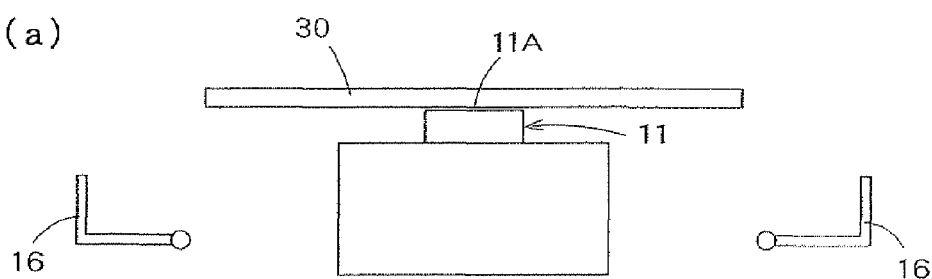
FIG. 9 includes diagrams (a)-(c) showing a constitution in which the wafer transfer mechanism has been modified in the pre-aligner apparatus shown in FIG. 1.
Figure 9:
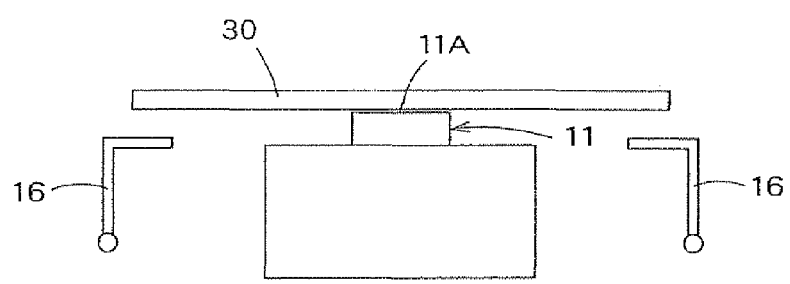
Figure 9:
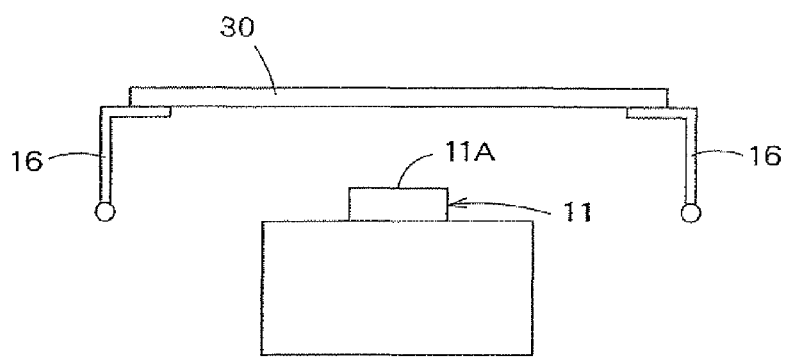

For example, the pin members 15 of the wafer transfer mechanism 13 of the above-mentioned embodiment can be replaced with L-shaped members 16 each having a L-shaped section as shown in FIG. 9. Each of the L-shaped members 16 is disposed so as to be rotatable about an axis parallel to the longitudinal direction thereof.

In this example, the position of the L-shaped member 16 having the L-shaped section can be changed between the set-aside position shown in FIG. 9(a) and the operative position shown in FIGS. 9(b) and (c). A lift drive and a rotation drive of the L-shaped member 16 can be performed by, for example, an air cylinder.

The preferable embodiments of the present invention have been explained above, but the above-mentioned embodiments can be appropriately modified within the scope of the present invention.

The invention claimed is:
1. A pre-aligner apparatus comprises:
a rotary mechanism configured to hold a semiconductor wafer and rotate the same,
a detection mechanism configured to detect a positioning cutout portion formed in the wafer, and a wafer transfer mechanism configured to lift the wafer from a wafer mounting portion of the rotary mechanism or mount the wafer on the wafer mounting portion, wherein the wafer transfer mechanism includes a drive mechanism and a pair of elongated members configured to hold the wafer at a position just above the wafer mounting portion, the pair of elongated members extending in a common plane parallel to the wafer, the pair of elongated members being movable in a horizontal direction and in a vertical direction, the drive mechanism includes (i) a pair of first link members, each of the pair of first link members having one end pivotally connected to a proximal end of a different one of the pair of elongated members respectively, and (ii) a second link member having i) a first end, ii) a second end, and iii) a rotatably supported central part, the first end being pivotally connected to another end of one of the pair of first link members, and the second end being pivotally connected to another end of another of the pair of first link members, the pair of the first link members and the second link member are structured such that rotating the second link member around the central part changes a distance between the pair of elongated members in the horizontal direction, and wherein the drive mechanism includes an air cylinder having an output shaft pivotally connected to the second link member, and a lifting drive mechanism configured to change a position of the pair of elongated members in the vertical direction.

2. The pre-aligner apparatus according to claim 1, wherein the pair of elongated members are respectively disposed on opposing sides with respect to a rotational axis of the rotary mechanism, the distance between the pair of elongated members in the horizontal direction being changeable between a first distance when the wafer is held and a second distance when the pair of elongated members move up or down while bypassing the wafer held by the rotary mechanism, the second distance being greater than the first distance.

3. The pre-aligner apparatus according to claim 1, wherein the drive mechanism controls the pair of elongated members to move between a position right above the wafer held by the rotary mechanism and a position right under the wafer held by the rotary mechanism, such that the pair of the elongated members move in the vertical direction after a distance between the pair of the elongated members in the horizontal direction is widened from a first distance to a second distance that is longer than the first distance, so that the pair of the elongated members bypass the wafer held by the rotary mechanism when moving in the vertical direction, and the pair of the elongated members move in the horizontal direction to narrow the distance between the pair of the elongated members in the horizontal direction from the second distance to the first distance after the pair of the elongated members move in the vertical direction, and the pair of the elongated members are configured to hold the wafer when the distance between the pair of the elongated members is the first distance.

4. A pre-aligner apparatus comprises:
a rotary mechanism configured to hold a semiconductor wafer and rotate the same, a detection mechanism configured to detect a positioning cutout portion formed in the wafer, and a wafer transfer mechanism configured to lift the wafer from a wafer mounting portion of the rotary mechanism, wherein the wafer transfer mechanism includes a drive mechanism and a pair of elongated members configured to move up so as to abut against a rear face of the wafer when lifting the wafer, the pair of elongated members extending in a common plane parallel to the wafer, the pair of elongated members being movable in a horizontal direction and in a vertical direction, the drive mechanism includes (i) a pair of first link members, each of the pair of first link members having one end pivotally connected to a proximal end of a different one of the pair of elongated members respectively, and (ii) a second link member having i) a first end, ii) a second end, and iii) a rotatably supported central part, the first end being pivotally connected to another end of one of the pair of first link members, and the second end being pivotally connected to another end of another of the pair of first link members, the pair of the first link members and the second link member are structured such that rotating the second link member around the central part changes a distance between the pair of elongated members in the horizontal direction, and wherein the drive mechanism includes an air cylinder having an output shaft pivotally connected to the second link member, and a lifting drive mechanism configured to change a position of the pair of elongated members in the vertical direction.

5. The pre-aligner apparatus according to claim 4, wherein the pair of elongated members are respectively disposed on opposing sides with respect to a rotational axis of the rotary mechanism, the distance between the pair of elongated members in the horizontal direction being changeable between a first distance when the wafer is held and a second distance when the pair of elongated members move up or down while bypassing the wafer held by the rotary mechanism, the second distance being greater than the first distance.

6. The pre-aligner apparatus according to claim 4, wherein the drive mechanism controls the pair of elongated members to move between a position right above the wafer held by the rotary mechanism and a position right under the wafer held by the rotary mechanism, such that the pair of the elongated members move in the vertical direction after a distance between the pair of the elongated members in the horizontal direction is widened from a first distance to a second distance that is longer than the first distance, so that the pair of the elongated members bypass a next wafer held by the rotary mechanism when moving in the vertical direction after the wafer lifted by the pair of elongated members has been carried out, and the pair of the elongated members move in the horizontal direction to narrow the distance between the pair of the elongated members in the horizontal direction from the second distance to the first distance after the pair of the elongated members move in the vertical direction, and the pair of the elongated members are configured to hold the next wafer when the distance between the pair of the elongated members is the first distance.

* * * * *